United States Patent [19]
Hosten et al.

[11] Patent Number: 5,211,826
[45] Date of Patent: May 18, 1993

[54] ELECTROPLATING MEANS FOR PERFORATED PRINTED CIRCUIT BOARDS TO BE TREATED IN A HORIZONTAL PASS

[75] Inventors: Daniel Hosten, Handzame; Josef Van Puymbroeck, Oostkamp, both of Belgium

[73] Assignee: Siemens Aktiengesellschaft, Munich, Fed. Rep. of Germany

[21] Appl. No.: 941,173

[22] Filed: Sep. 4, 1992

[30] Foreign Application Priority Data

Sep. 26, 1991 [DE] Fed. Rep. of Germany ....... 4132145

[51] Int. Cl.$^5$ .............................................. C25D 17/00
[52] U.S. Cl. ..................................... 204/198; 204/275
[58] Field of Search ................................ 204/198, 275

[56] References Cited

U.S. PATENT DOCUMENTS

| | | | |
|---|---|---|---|
| 4,385,967 | 5/1983 | Brady et al. | 204/27 |
| 4,459,183 | 7/1984 | Brady et al. | 204/27 |
| 4,755,271 | 7/1988 | Hosten | 204/198 |
| 4,832,811 | 5/1989 | Hosten | 204/198 |
| 4,986,888 | 1/1991 | Hosten | 204/198 |

FOREIGN PATENT DOCUMENTS

| | | |
|---|---|---|
| 0254962 | 2/1988 | European Pat. Off. . |
| 0276725 | 9/1991 | European Pat. Off. . |
| 3236545 | 10/1981 | Fed. Rep. of Germany . |

Primary Examiner—T. M. Tufariello
Attorney, Agent, or Firm—Hill, Steadman & Simpson

[57] ABSTRACT

An electroplating apparatus having a plurality of upper electrolyte feeder elements and upper electrolyte discharge elements aligned transversely relative to a throughput path of the printed circuit boards and arranged in alternation above the throughput path, a plurality of lower electrolyte feeder elements and lower electrolyte discharge elements aligned transversely relative to the throughput path and arranged in alternation under the throughput path, wherein each lower electrolyte discharge element is positioned opposite an upper electrolyte feeder element and each upper electrolyte discharge elements is positioned opposite a lower electrolyte feeder element, and wherein vertical and horizontal flow components of the electrolyte solution result and their direction alternatingly changes as seen along the throughput path of the printed circuit boards.

5 Claims, 1 Drawing Sheet

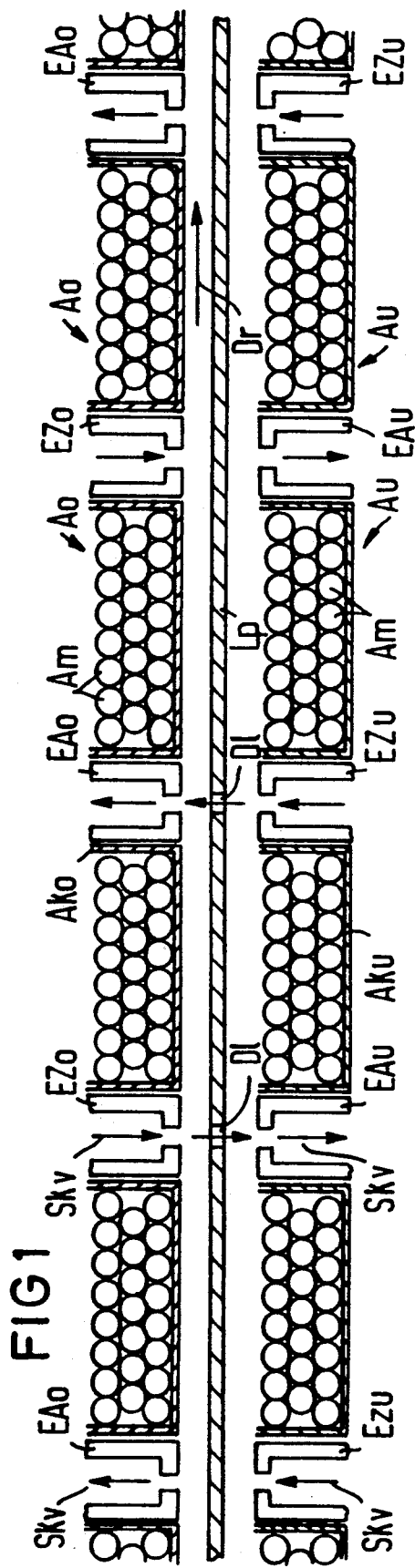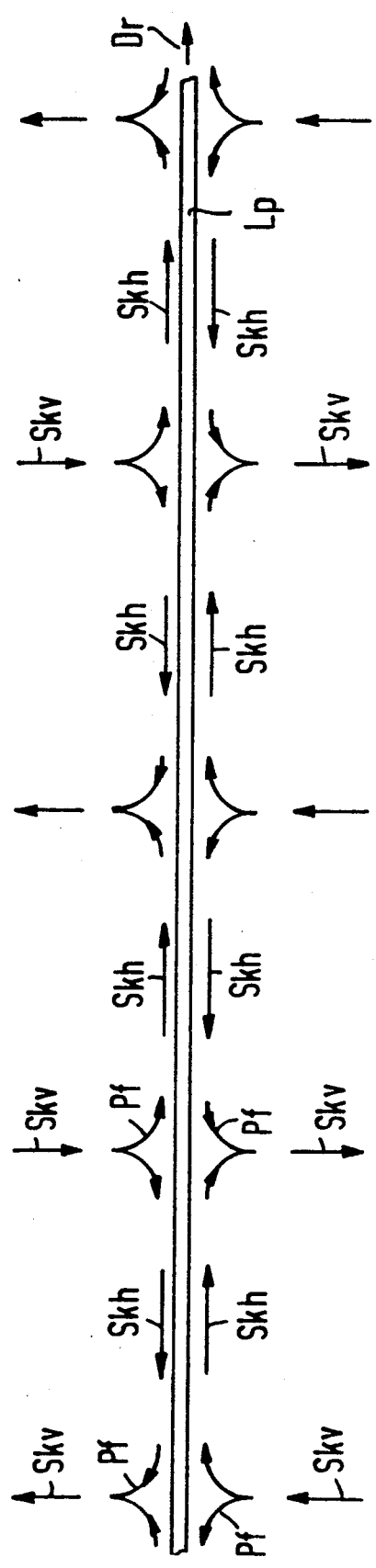

ELECTROPLATING MEANS FOR PERFORATED PRINTED CIRCUIT BOARDS TO BE TREATED IN A HORIZONTAL PASS

BACKGROUND OF THE INVENTION

1. Field of the Invention

The present invention is related to an electroplating apparatus for electroplating perforated printed circuit boards during horizontal movement, and in particular to such an apparatus having vertical flow components of the electrolyte solution.

2. Description of Related Art

DE-A-32 36 545 discloses an electroplating apparatus for printed circuit boards, wherein the printed circuit boards are fed horizontally through an electrolyte bath. Driven contacting wheels arranged at one side in the bath feed the printed circuit boards (workpieces) and simultaneously assume the cathodic contacting of the workpieces. A special glide gripping is arranged in the bath at the side opposite the contacting wheels to guide and hold the workpieces. Anodes in the electrolyte bath are soluble anode rods aligned transversely relative to a throughput path and arranged above and below the throughput path.

In another embodiment of DE-A-32 36 545, the upper and lower anodes can be formed by titanium baskets containing the soluble anode material in ball form. Blast connections to which the electrolyte solution is supplied from a reservoir by a plurality of immersion pumps are arranged in the collecting tank of the electroplating means above and below the throughput path. The blast connections are aligned in the throughput direction. The high flow rate of the electrolyte solution through the blast connections refills the bath zone to the desired level and also mixes the electrolyte solution well, ensuring a uniform composition and a uniform current density of the electrolyte solution. For producing even greater turbulence in the bath, the blast connections can be moved back and forth horizontally or in the throughput direction.

EP-A-0 254 962 discloses another electroplating apparatus for treating printed circuit boards during horizontal movement, wherein forceps-shaped contact clamps are provided as conveyor and contacting elements. The contact clamps are arranged on an endlessly circulating drive and clamp the lateral edges of the printed circuit boards.

EP-B-0 276 725 also discloses an electroplating means for treating perforated printed circuit boards during horizontal motion. Electrolyte collectors having openings for the intake and/or outflow of the electrolyte solution, which is directed between the throughput path and the upper or lower anode, are arranged above and below the throughput path and are aligned transversely relative to the throughput path at both the admission side and the discharge side. The arrangement of the electrolyte collectors produces longitudinal flow components in the electrolyte liquid. Flow nozzles aligned transversely relative to the throughput direction produce vertical flow components of the electrolyte solution. These vertical flow components are significant for producing through-contactings in the perforated printed circuit boards.

The current technology in the electroplating of printed circuit boards does not produce optimum quality and distribution of layer thicknesses of the deposited metal layers.

SUMMARY OF THE INVENTION

It is an object of the present invention to improve the quality and distribution of layer thicknesses of the deposited metal layers in the through-contacting and electroplating of printed circuit boards. In the exemplary embodiment, this improvement is realized via the alternating directional change of the vertical flow components of the electrolyte solution, which ensure thorough flooding of through-contacting holes. The direction of the vertical flow components alternatingly changes along the throughput path, as seen in the throughput direction. Similarly, the direction of the horizontal flow components formed above and below the throughput path alternatingly changes along the throughput path, as seen in the throughput direction. As a result of the directional change of the vertical and horizontal flow components which, moreover, are completely independent of the length of the electroplating apparatus, high quality metal layers having good ductility, high adhesion, and an extraordinarily uniform distribution of layer thicknesses can be deposited even given high current densities.

In the exemplary embodiment, upper and lower electrolyte feeder elements are designed as flow nozzles. Thus, highly pronounced vertical flow components are formed economically and simply. The exemplary embodiment includes a plurality of spaced upper anode baskets and a plurality of spaced lower anode baskets. Further advantages are realized where the upper electrolyte feeder elements and the upper electrolyte discharge elements are alternatingly disposed between the upper anode baskets. This enables integration of the upper electrolyte feeder and/or upper electrolyte discharge elements with the upper anode given good accessibility of the anode material. Further advantages are also realized where the lower electrolyte feeder elements and the lower electrolyte discharge elements are alternatingly disposed between the lower anode baskets, which enables an integration of the lower electrolyte feeder elements and/or the lower electrolyte discharge elements with the lower anode.

BRIEF DESCRIPTION OF THE DRAWINGS

An exemplary embodiment of the invention is shown in the drawing and is described in greater detail below.

FIG. 1 shows the inventive arrangement of electrolyte feeder elements and electrolyte discharge elements.

FIG. 2 shows the formation of horizontal and vertical flow components given the arrangement of FIG. 1.

DESCRIPTION OF THE PREFERRED EMBODIMENTS

The printed circuit boards Lp to be electroplated oriented horizontally, are conveyed through an electrolyte solution (not shown in detail). The printed circuit boards move in a horizontal throughput direction Dr between an upper anode Ao and a lower anode Au. The upper anode Ao is composed of individual upper anode baskets Ako containing spherical anode material Am. Similarly, the lower anode Au is composed of individual lower anode baskets Aku containing spherical anode material Am. In the exemplary embodiment, the anode baskets Ako and Aku are composed of titanium and the anode material Am is copper balls.

Upper electrolyte feeder elements EZo and upper electrolyte discharge elements EAo are alternatingly disposed between said upper anode baskets Ako relative to the throughput direction and lie above the throughput path of the printed circuit boards Lp. This combination of upper electrolyte feeder elements and upper electrolyte discharge elements forms an upper means and creates a first sequentially alternating flow of electrolyte in the throughput path. Arrangements other than the alternation described in the exemplary embodiments are also possible.

Lower electrolyte discharges EAu and lower electrolyte feeders EZu are also alternatingly disposed between said lower anode baskets Aku relative to the throughput direction and lie under the throughput path of the printed circuit boards Lp. An upper electrolyte feeder element EZo always lies opposite a lower electrolyte discharge element EAo. This combination of lower electrolyte feeder elements and lower electrolyte discharge elements forms a lower means and creates a second sequentially alternating flow of electrolyte in the throughput path. An upper electrolyte discharge element EAo always lies opposite a lower electrolyte feeder element EZu.

The upper and lower electrolyte feeder elements EZo and EZu are designed as flow nozzles in the exemplary embodiment and are aligned transversely relative to the throughput path. Said upper and lower electrolyte feeder elements generate flow components Skb of the electrolyte solution that are vertically directed onto the surface of the printed circuit boards Lp.

The upper and lower electrolyte discharge elements EAo and EAu are also designed as flow orifices whose slots have a larger cross-section than the upper and lower electrolyte feeder elements. Said upper and lower electrolyte discharge elements are also positioned transversely relative to the throughput path and discharge the electrolyte solution with vertical flow components Skb leading away from the surface of the printed circuit boards Lp. Consequently, electrolyte solution flows through through-contacting holes D1 of the printed circuit boards Lp vertically from top to bottom between an upper electrolyte feeder element EZo and a lower electrolyte discharge element EAu, and vertically from bottom to top between a lower electrolyte feeder element EZu and an upper electrolyte discharge element EAo. The flow of electrolyte solution through through-contacting holes is shown at two locations in FIG. 1.

The distribution of vertical flow components Skv and horizontal flow components Skh of the electrolyte solution shown in FIG. 2 results during throughput of the printed circuit boards Lp through the electroplating apparatus. The flow components Skv vertically directed onto the surface of the printed circuit boards Lp are deflected in the direction of arrows Pf and horizontal flow components Skh. The horizontal flow components Skh are then deflected in the direction of arrows Pf in the region of the upper and lower electrolyte discharge elements. Thus, vertical flow components Skv leading away from the surface of the printed circuit boards Lp arise.

As FIG. 2 shows, an alternating directional change of the vertical flow components Skv and of the horizontal flow components Skh results as seen in the throughput direction Dr of the printed circuit boards Lp due to the specific arrangement of the upper and lower electrolyte feeder elements EZa and EZu and of the upper and lower electrolyte discharge elements EAo and EAu (see FIG. 1).

The feed of the electrolyte solution, not shown in the drawing, to each upper electrolyte feeder element EZo may occur via a common pump. A common pump may similarly be used to feed the electrolyte solution to each lower electrolyte feeder element EZu. These two pumps draw the electrolyte solution from a reservoir into which the discharge lines (not shown) of the upper and lower electrolyte discharge elements EAo and EAu discharge.

The alternating directional change of the vertical flow components Skv and of the horizontal flow components Skh shown in FIG. 2 leads to optimum distribution of the layer thicknesses of the electro-deposited layers, both on the surfaces of the printed circuit boards Lp as well as in the through-contacting holes D1 (see FIG. 1). The conveying and cathodic contacting of the printed circuit boards Lp are not shown in the drawing. Contacting wheels, contacting drums, or tong-shaped contact clamps that are entrained with the printed circuit boards may be used for this purpose. Of course, any conveying means and electric contacting means would be effective.

Although modifications and changes may be suggested by those skilled in the art, it is the intention of the inventors to embody within the patent warranted hereon all changes and modifications as reasonably and properly come within the scope of their contribution to the art.

In U.S. Pat. No. 4,755,271 the teachings of which are incorporated herein by reference, an apparatus for electroplating plate shaped workpieces is disclosed. In that apparatus, tong-shaped contact clamps are used for cathodic contacting the workpiece and for transporting the workpiece through the apparatus.

We claim as our invention:

1. An electroplating apparatus for electroplating perforated printed circuit boards undergoing horizontal movement in a throughput path, comprising:
   (a) at least one upper anode above said throughput path;
   (b) at least one lower anode under said throughput path;
   (c) a plurality of upper electrolyte feeder elements and a plurality of upper electrolyte discharge elements aligned transversely and in alternation above said throughput path forming in combination an upper means for creating a first sequentially alternating flow of electrolyte in said throughput path;
   (d) a plurality of lower electrolyte feeder elements and a plurality of lower electrolyte discharge elements aligned transversely and in alternation under said throughput path forming in combination a lower means for creating a second sequentially alternating flow of electrolyte in said throughput path; and
   (e) said upper means and said lower means being positioned relative to each other so that said first sequentially alternating flow flows oppositely with respect to said second sequentially alternating flow.

2. The electroplating apparatus of claim 1, wherein the upper and lower electrolyte feeder elements are flow nozzles having flow components vertically directed onto the surface of the printed circuit boards.

3. The electroplating apparatus of claim 1, further comprising a plurality of spaced upper anode baskets, wherein said upper electrolyte feeder elements and said upper electrolyte discharge elements are alternatingly disposed between said upper anode baskets.

4. The electroplating apparatus of claim 1, further comprising a plurality of spaced lower anode baskets, wherein said lower electrolyte feeder elements and said lower electrolyte discharge elements are alternatingly disposed between said lower anode baskets.

5. An electroplating apparatus for electroplating perforated printed circuit boards undergoing horizontal motion in a throughput path, comprising:

(a) at least one upper anode positioned above said throughput path;

(b) at least one lower anode positioned under said throughput path;

(c) an upper means aligned transversely above said throughput path for generating a first alternating flow of electrolyte in said throughput path;

(d) a lower means aligned transversely below said throughput path for generating second alternating flow of electrolyte in said throughput path; and (e) said upper means and said lower means positioned such that components other than vertical components of a flow pattern formed by the upper means mirror and flow opposite a flow pattern formed by the lower means.

* * * * *